(12) United States Patent
Berkenbush et al.

(10) Patent No.: US 9,363,915 B1
(45) Date of Patent: Jun. 7, 2016

(54) ADAPTABLE SLICE ELECTRONICS PACKAGING

(71) Applicant: BAE SYSTEMS Information and Electronic Systems Integration Inc., Nashua, NH (US)

(72) Inventors: Richard E. Berkenbush, Pompton Plains, NJ (US); Edward D. O'Neill, Totowa, NJ (US); Christopher Errick, West Milford, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 520 days.

(21) Appl. No.: 13/712,204

(22) Filed: Dec. 12, 2012

Related U.S. Application Data

(60) Provisional application No. 61/630,631, filed on Dec. 14, 2011.

(51) Int. Cl.
| | |
|---|---|
| *H01R 43/00* | (2006.01) |
| *H05K 13/00* | (2006.01) |
| *H05K 7/02* | (2006.01) |
| *H05K 7/20* | (2006.01) |

(52) U.S. Cl.
CPC ............. *H05K 7/026* (2013.01); *H05K 7/2039* (2013.01); *H05K 7/20136* (2013.01); *H05K 13/0023* (2013.01); *Y10T 29/49133* (2015.01); *Y10T 29/49826* (2015.01)

(58) Field of Classification Search
CPC .. H01L 23/367; G11B 33/128; G11B 33/142; G11B 33/022; H01R 13/514; H01R 13/518; H01R 9/2408; Y10T 29/49002; Y10T 29/49133; Y10T 29/49826
USPC ......... 29/854, 592.1, 834, 836; 361/728, 729, 361/730, 736, 796, 807
See application file for complete search history.

(56) References Cited

U.S. PATENT DOCUMENTS

| 4,918,572 A * | 4/1990 | Tarver ....................... G06F 1/18 361/736 |
|---|---|---|
| 6,795,318 B2 * | 9/2004 | Haas ................... H04M 1/0256 361/728 |

* cited by examiner

*Primary Examiner* — Thiem Phan
(74) *Attorney, Agent, or Firm* — Sand & Sebolt, LPA; Daniel J. Long

(57) ABSTRACT

A system and method for building an electronic system with line-replaceable units (LRUs) is presented. The system includes a first LRU electronic module with a first connector on a side of the first LRU electronic module and a second LRU electronic module with a second connector on a side of the second LRU electronic module. To build the electronic system, the first connector on the first LRU electronic module is connected to the connector on the second LRU electronic module to form a first LRU electronic module and a second LRU electronic module combination with the first connector and the second connector interior to the module combination formed by the first LRU electronic module and the second LRU electronic module. The first connector and the second connector cannot be seen from outside the module combination formed by the first LRU electronic module and the second LRU electronic module.

20 Claims, 4 Drawing Sheets

ADAPTABLE SLICE ELECTRONICS PACKAGING

CROSS REFERENCE TO RELATED APPLICATION

This application claims priority from U.S. Provisional Application Ser. No. 61/630,631, filed Dec. 14, 2011; the disclosure of which is incorporated herein by reference.

BACKGROUND OF THE INVENTION

1. Field of Invention

The current invention relates generally to apparatus, systems and methods for connecting together electronic equipment. More particularly, the apparatus, systems and methods relate to connecting line-replaceable units (LRUs) together. Specifically, the apparatus, systems and methods provide for connecting electronic modules together using hidden connectors and/or an elongated bridge connectors.

2. Description of Related Art

Many electronics packaging approaches are in use today, each having advantages and disadvantages. For applications that require modularity, efficient cooling, high degree of structural integrity, low cost, minimum size, module to module interconnects and host interfaces on a common face, the options are few. One common approach is the single box approach with installed shop replaceable units (SRUs) and side wall heat exchangers. This approach has significant costs involved in producing the chassis and the interconnect. A packaging approach with modules stacked front to back results in serial cooling inefficiencies and space penalties for interconnects front to back and limited access to a host front panel. A need, therefore, exists for a module packing approach with improved space and cooling characteristics.

SUMMARY

In the preferred embodiment, an adaptable slice/side-to-side modular approach allows electronic modules to receive interconnect directly from the front panel. Side finned heat exchangers can provide parallel cooling front to back. Module to module interfaces are accomplished through side blind mating connectors and interconnection is accomplished through module front panel connections and cables. Minimal costs associated with interconnection are achieved with minimal volume allocation. Additionally, this adaptable slice approach allows, for example, a radio or other device to be upgraded with new and different slices to address different applications, functions and host interfaces while maintaining commonality with core sections of the radio.

The preferred embodiment can also be configured as a system built with line-replaceable units (LRUs). The preferred embodiment includes a first LRU electronic module with a first connector on a side of the first LRU electronic module and a second LRU electronic module with a second connector on a side of the second LRU electronic module. The second connects to the first connector when the first LRU electronic module is connected to the second LRU electronic module to form a first and second LRU electronic module combination. The first and second connectors are completely interior to the module combination when it is connected together.

In some configurations of the preferred embodiment, a third connector can be located on a side of the second LRU electronic module. The system can include a third LRU electronic module with a fourth connector on a side of the third LRU electronic module and it can connect to the third connector when the second LRU electronic module is connected to the third LRU electronic module. The third connector and the fourth connector are completely interior to an LRU module combination formed by the first LRU electronic module, the second LRU electronic module and the third LRU electronic module. The connections between the first and second connectors and the third and fourth connectors are completely hidden from view when the combination of the first, second and third modules are attached together.

Another configuration of the electronic system built with LRUs includes notches in the first, second and third LRU electronic modules. An elongated bridge connector can be placed in the first, second notch and third notches and electrically connects together the first LRU electronic module to the third LRU electronic module through the bridge connector. The elongated bridge connector passes through a notched area of the second LRU electronic module and does not electrically connect to the second LRU electronic module. However, fastening devices connect the elongated bridge connector to the second LRU electronic module.

Another configuration of the preferred embodiment includes a fan adapted to cool the first, second and third LRU electronic modules. The fan spans across the first LRU electronic module, the second LRU electronic module and the third LRU electronic module. First, second and third patterns of cooling fins are located respectively in each of the first, second and third LRU electronic modules. The first pattern of cooling fins is different than the second pattern of cooling fins, and the second pattern of cooling fins is different than the third pattern of cooling fins. This provides for cooling fins for each of the three LRU electronic modules to have custom cooling in areas where it is most needed. In operation, the fan pulls air across the first pattern of cooling fins, the second pattern of cooling fins and the third pattern of cooling fins.

In general, when the electronic system built with LRUs is assembled the first, second and third LRU electronic modules to form an LRU module combination that is generally rectangular in shape. The electronic system can be a radio with the first LRU electronic module being a power supply, the second LRU electronic module being a radio core, and the third LRU electronic module being a power amplifier. The radio created using LRU electronic modules can be mounted in an electronic chassis.

Another configuration of the preferred embodiment is a method for connecting electronic modules that are line-replaceable units (LRUs). The method begins by aligning a connector on the side of a first electronic module with a connector on the side of a second electronic module. The first electronic module and the second electronic module are pushed together so that the connector on the side of a first electronic module is electrically connected to the connector on the side of a second electronic module. When the first electrical module and the second electrical module are connected together, the connector on the right side of a first electronic module and the connector on the left side of a second electronic module are hidden from view and are connected without requiring any cables.

The method can optionally perform some other tasks. For example, the method can install a fan that spans both the first electrical module and the second electrical module. The fan pulls air through the first electronic module and the second electronic module. The routes that air travels through both modules can be custom designed so that air routed through the first electronic module is routed in a way that is best for the first module and air is routed through the second electronic module differently that the first electronic module but in a way that best for the second module. An elongated connector bridge can be placed in notches formed in the first electrical module and the second electrical module. The connector bridge is elongated with a first and a second end with connectors located at the first end and the second end. The connector located at the first end of the connector bridge is connected to a connector located in the notch of the first electronic module and the connector located at the second of the connector bridge end is connected to a connector located in the notch of the second electronic module. The first electrical module and the second electrical module can be fastened together to create an assembled electronic module that can be installed into an electronic chassis. For example, the modules can be fastened together with threaded fastening devices such as bolts or screws.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
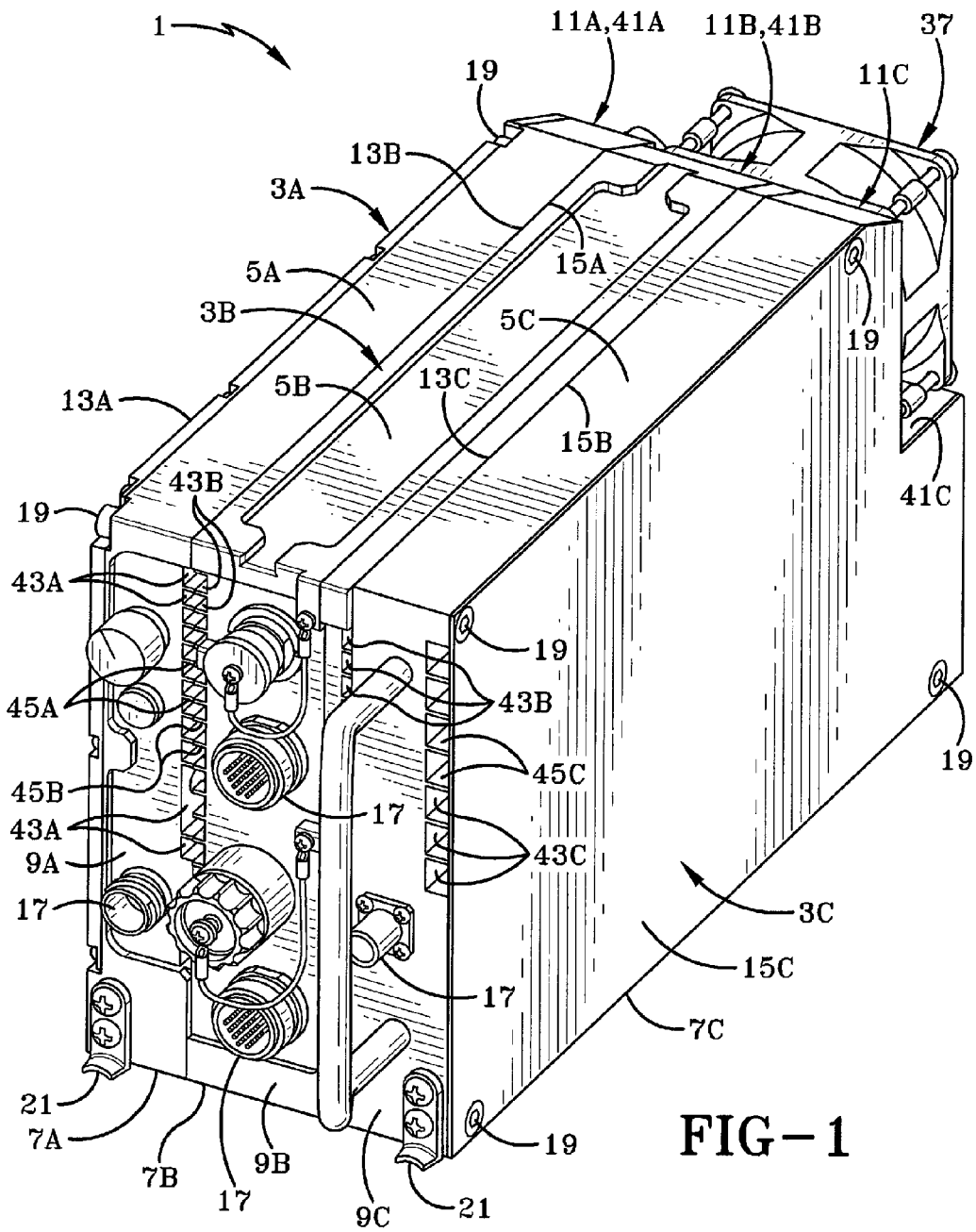
FIG. 1 illustrates a right side isometric view of the preferred embodiment of an electronic system built with line-replaceable units (LRUs).
Figure 2:
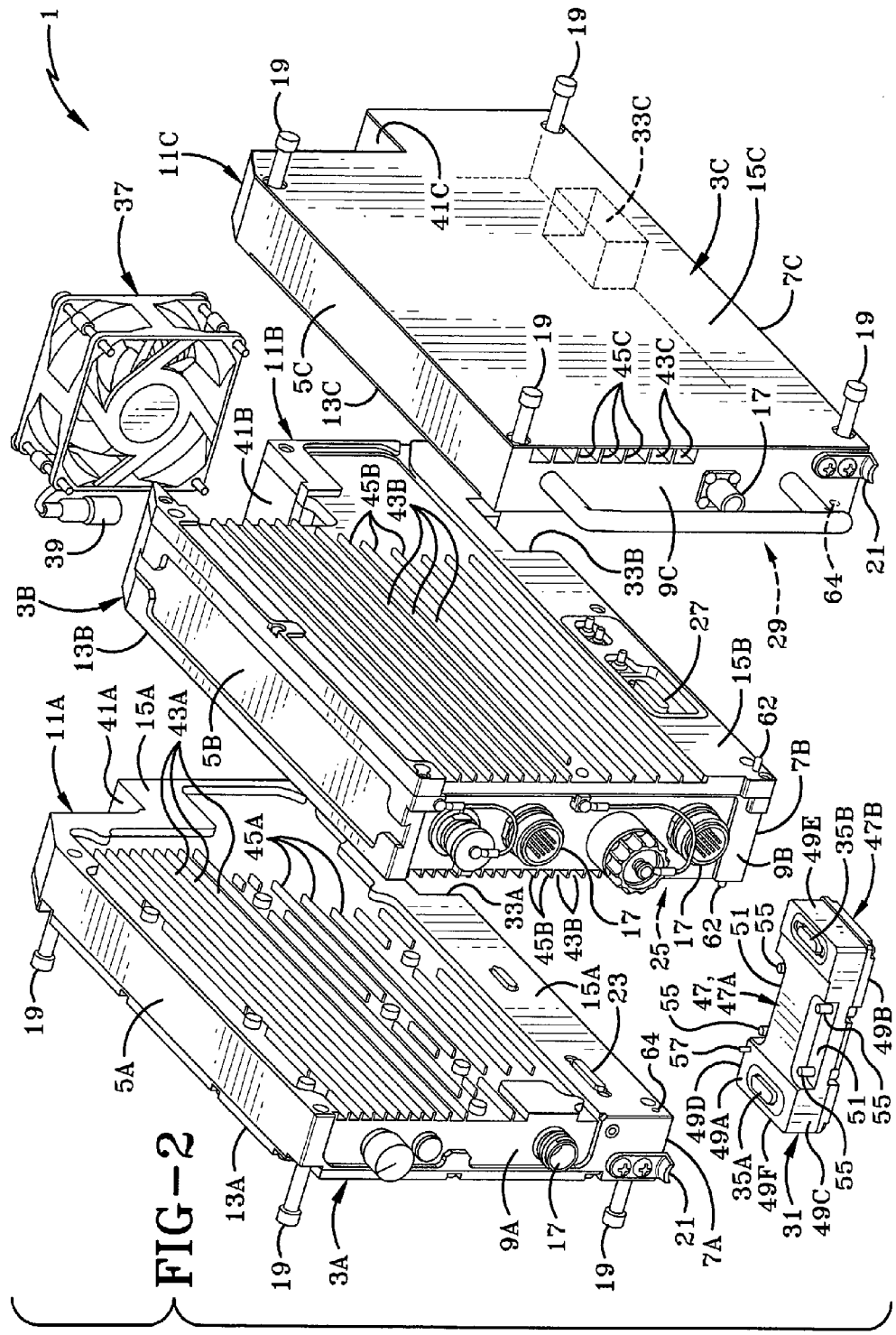
FIG. 2 illustrates a right side exploded isometric view of the preferred embodiment of the electronic system built with LRUs.
Figure 3:
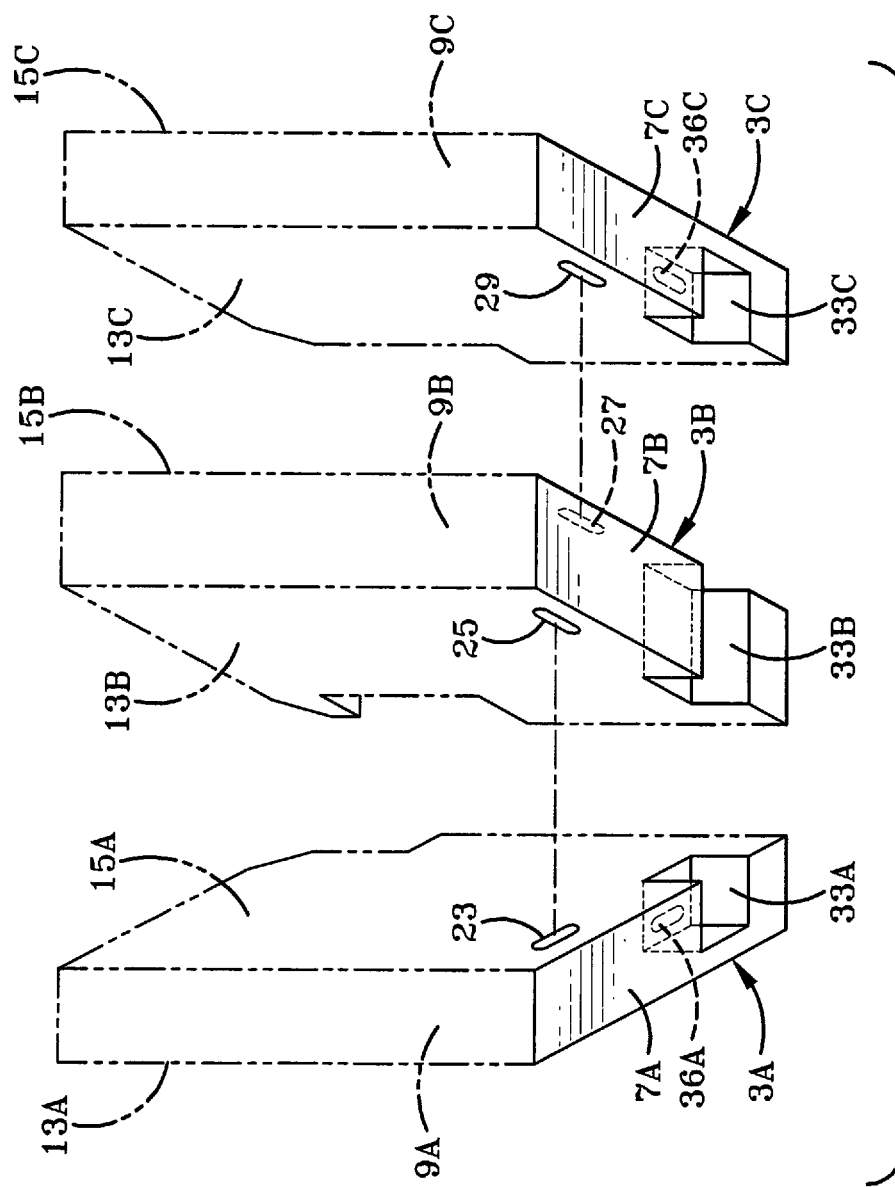
FIG. 3 illustrates a bottom side exploded perspective view of the preferred embodiment of the electronic system built with LRUs.

FIG. 1-3 illustrate an example electronic system 1 that includes three electronic modules 3A-B. The electronic modules 3A-C are sometimes called "slices". For example, the electronic system 1 can be radio system where electronic module 3A is a radio power supply, electronic module 3B is the core radio and electronic module 3C is the power amplifier of the radio. In some configurations of the preferred embodiment, the electronic modules 3A-C can be connected together to form the electronic system 1 and then this system can be plugged or mounted into an electronic chassis housing a larger electronic system. Each electronics module 3A-C has a respective top side 5A-C, bottom side 7A-C, front side 9A-C, back side 11A-C, left side 13A-C and right side 15A-C. Each module 3A-C can also have one or more connectors 17 on the front to allow it to be connected to a host system. Of course, the electronic system 1 could have more than three electronic modules or as few as two electronic modules.

In the preferred embodiment, the electronic modules 3A-C can be line-replaceable (or lowest-replaceable) units (LRUs) or line-replaceable components (LRCs). The electronic modules 3A-C can also be referred to as a first LRU electronic module 3A, a second LRU electronic module 3B and a third LRU electronic module 3C. Line (or lowest) replaceable units (LRUs) are modular components used in, for example, airplanes, ships, vehicles, spacecraft and the like. These modules are designed to be replaced quickly at an operating location. A line-replaceable unit (LRU) is usually a sealed unit such as a radio or other auxiliary equipment. LRUs are typically assigned logistics control numbers (LCNs) or work unit codes (WUCs) to manage logistics operations.

LRUs improve maintenance operations, because they can be stocked and replaced quickly from on-site inventory, restoring the system to service, while the failed (unserviceable) LRU is undergoing maintenance. Because they are modular, they also reduce system costs and increase quality, by centralizing development across different models of vehicles. The term LRU has been in use for decades, For example the military document MIL-PRF-49506, Notice 1 of 18 Jan. 2005, the Performance Specification for Logistics Management Information defines an LRU as: "An LRU is an essential support item which is removed and replaced at the field level to restore the end item to an operational ready condition. Conversely, a non-LRU is a part, component, or assembly used in the repair of an LRU, when the LRU has failed and has been removed from the end item for repair."

LRUs are designed to specifications to assure that they can be interchanged, especially if they are from different manufacturers. Usually a class of LRUs will have coordinated environmental specifications (i.e. temperature, condensation, etc.). However, each particular LRU will also have detailed specifications describing its function, tray size, tray connectors, attachment points, weight ranges, etc. It is common for LRU trays to have standardized connections for rapid mounting, cooling air, power and grounding. The mounting hardware is often manually-removable, standard screw-detent quick-release fittings. Front-mounted electrical connectors are often jacks for ring-locked cannon plugs that can be removed and replaced (R&R) without tools. Specifications also define the supporting tools necessary to remove and replace the unit. Many require no tools, or a standard-sized Frearson screwdriver. Frearson is specified for some vehicles and many marine systems because Frearson screws are not designed to cam-out, and the same screwdriver can be used on many sizes of screws. Many LRUs also have handles, and specific requirements for their bulk and weight. LRUs typically need to be "transportable" and fit through a door or hatchway. There are also requirements for flammability, unwanted radio emissions, resistance to damage from fungus, static electricity, heat, pressure, humidity, condensation drips, vibration, radiation and other environmental measurements.

LRUs may be designed to Aeronautical Radio Incorporated's (ARINC's) 700-series standards. The form factor of LRUs comply with ARINC Standards, ARINC 404 and ARINC 600. LRUs are also defined by manufacturers like Airbus and Boeing and by various military organizations. In the military, electronic LRUs are typically designed to interface according to data bus standards such as MIL-STD-1553. On the International Space Station, LRUs are referred to as Orbit Replaceable Units.

When assembled the electronic modules 3A-3C can be connected together with fastening devices 19. For example, the electronic modules 3A-3C can be connected together using complementary bolts that are threaded together near the corners of the electronic modules 3A-C. When assembled, mounting brackets 21 can be mounted to the electronic system 1 at various positions. For example, Aeronautical Radio Incorporate (ARINC) type of mounting device can be attached to the electronic system.

Historically electronic modules were constructed as completed modular units that only provided for electrical connections on their front sides and rear sides. However, the preferred embodiment of the electronic system 1 provides for blind mating connectors that provide for a way to connect the electronic modules 3A-C together by providing one or more connectors on the right side 15A-C to be connected to another connector(s) on the left side 13A-C of another module at a time the modules 3A-C are connected together. For example, FIGS. 2 and 3 illustrate a connector 23 on the right side 15A of electronic module 3A that is connected to connector 25 on the left side 13B of electronic module 3B. Similarly, a connector 27 on the right side 15B of electronic module 3B that is connected to connector 29 on the left side 13C of electronic module 3C. These connectors may be pairs of male and female connectors or other types of electronic connectors. Preferably, the connectors are each rigidly attached to their respective electronic modules 3A-C an positioned so that when the electronic modules 3A-C are properly positioned and connected together to form the electronic system 1 that the pairs of respective connectors are each properly aligned and then fastened together. One or more of the electronic modules 3A-C can contain holes 64 and/or guide pins 62 to further align and assist with connecting the modules and connectors to each other.

The electronic system 1 can also include an electronic connector bridge 31 as best seen in FIG. 2. The electronic connector bridge 31 is used to make further electrical connections between two different electronic modules 3A-C. For example, the illustrated electronic connector bridge 31 is placed in notches 33A-C located in the bottom sides 7A-C of the electronic modules 3A-C. The electronic connector bridge 31 contains connectors 35A, 35B with required wiring between these connectors 35A, and 35B. When the electronic system 1 is assembled, the connectors 35A, 35B of the electronic connector bridge 31 are connected to complementary connectors 36A, 36C adjacent upper portions of the notches. In the preferred embodiment, the electronic connector bridge is formed with a solid body portion 47 that includes a first portion 47A and a second portion 47B that are connected together and house internal wiring that connects connectors 35A and 35B together. The electronic connector bridge 31 is formed with a top side 49A, bottom side 49B, front side 49C, back side 49D, right side 49E, and left side 49F. The electronic connector bridge 31 can have recessed areas 51 between where the top side 49A meets the front side 49C and the back side 49D. It can have other recessed areas where the bottom side 49B meets the front side 49C and the back side 49D. Screws 55 or other fastening devices can be located in these recessed areas 51 that can be used to attach the electronic connector bridge 31 to one or more of the electronic modules 3A-C. In other configurations, these screws can be or can act like guide pins for aligning the electronic connector bridge 31 with the electronic modules 3A-C while attaching it to them. The electronic connector bridge 31 can also contain one or more guide pins 57 used solely for that purpose.

The Figures illustrate one example using an electronic connector bridge 31 to electrically connect the left electronic module 3A to the right electronic module 3C; however, in other examples and configurations the central electronic module 3B could be connected to the left electronic module 3A and/or right electronic module 3C. Of course if more than three electronic modules are used, then an electronic connector bridge could span any number of those electronic modules and electrically connect any number of those electronic modules together. Also, more than one electronic connector bridge could be used in the electronic system 1. Additionally, the electronic connector bridge 31 could be located in notches in the top sides 5A-C or in other sides of the electronic modules 3A-C.

The electronic system 1 further includes a fan 37 with a power connector 39 the can be plugged into the power supply module 3A to provide power for the fan 37. The fan 37 spans all three electronic modules 3A-C in the preferred embodiment. In other configurations, the fan 37 may span a different number of electronic modules or can span a portion of a number of electronic modules making up an electronic system 1. When the system 1 is assembled, the fan 37 fits within fan notches 41A-C or cutouts in the electronic modules 3A-C. The fan 37 can be fastened to the electronic modules 3A-C with bolts or fastened to the electronic modules 3A-C in another appropriate way.

Each electronic module has air input openings 43A-C in their front sides 9A-C that allow the fan 37 to pull cooling air into through the electronic system 1 when the electronic system 1 is assembled and functioning. When the electronic system 1 is disassembled as shown in the exploded views of FIGS. 2 and 3 these opening appear as notches. Air passes from the openings 43A-C through guide routes as guided by guide fins 45A-C until the air exits out the rear back sides 11A-C of the electronic modules 3A-C. In other configurations, the fan might not span all electronic modules 3A-C if some of the electronic modules 3A-C do not need air cooling and in other configurations air may flow from the rear back sides 11A-C to the front sides 7A-C or can enter and exit the electronic system from other places. By having a modular electronic system 1 it is now possible for each electronic module 3A-C to independently route its cooling air through its own module in a way that best cools each module.

As mentioned earlier and now summarized here, the preferred embodiment also provides parallel cooling front to back via module side finned heat exchangers. Module to module interfaces are accomplished through side blind mating connectors and interconnection is accomplished when electronic module slices are connected together. Therefore, minimal costs associated with interconnection are achieved with minimal volume allocation because no interconnect cables are needed. Additionally, this adaptable electronic module slice approach allows, for example, a radio or other device to be upgraded with new and different slices to address different applications, functions and host interfaces while maintaining commonality with core sections of the radio.

Those skilled in the art will appreciate that the electronics packaging approach of this invention provides low cost interconnect, even cooling through separate finned heat exchanger for each module and low volume allocated to interconnect.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
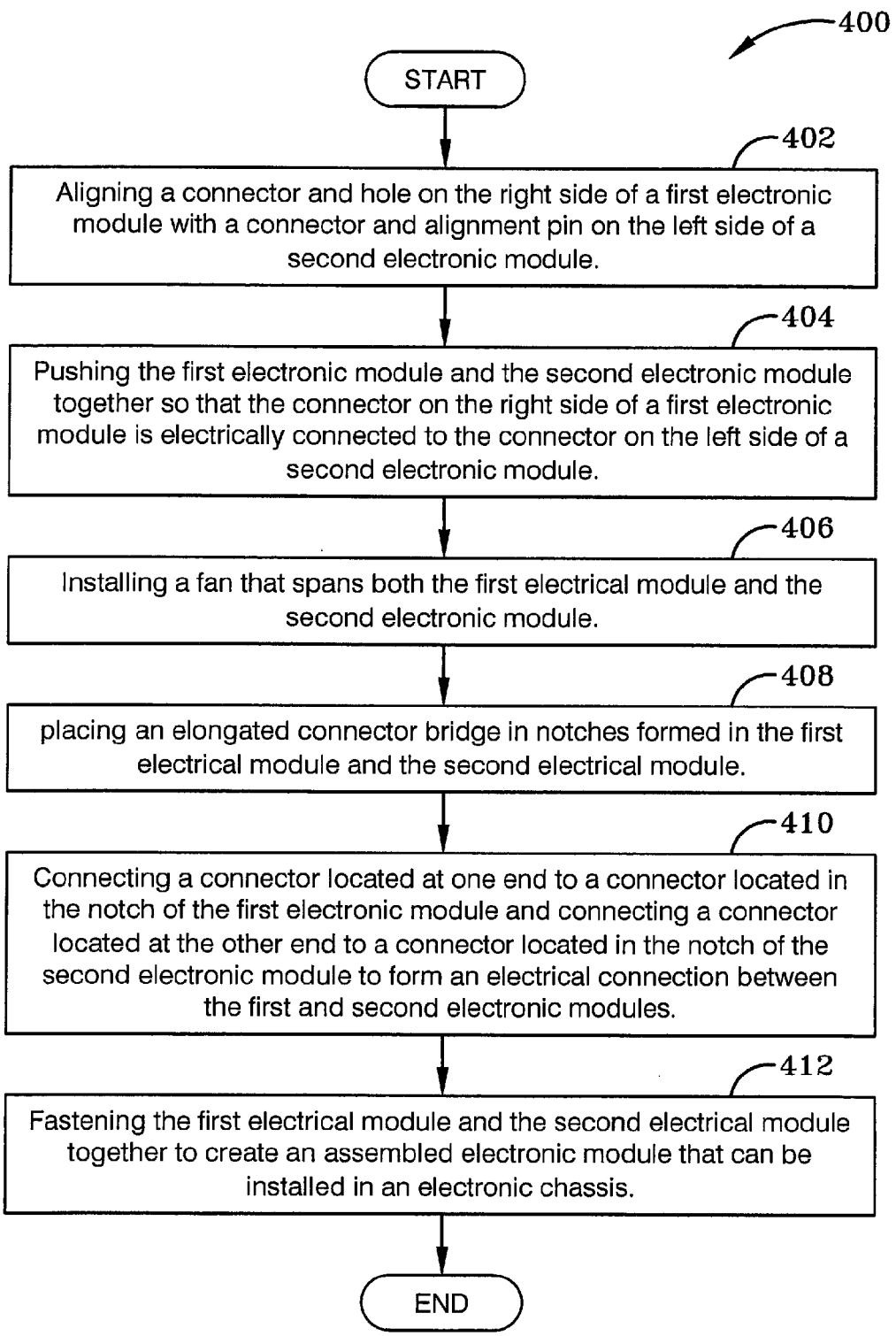
FIG. 4 illustrates an embodiment of a method for connecting electronic modules that are LRUs.

FIG. 4 illustrates a method 400 for connecting electronic modules that are line-replaceable units (LRUs). The method 400 begins by aligning a connector and hole on the right side of a first electronic module with a connector and alignment pin on the left side of a second electronic module, at 402. The first electronic module and the second electronic module are pushed together, at 404, so that the connector on the right side of a first electronic module is electrically connected to the connector on the left side of a second electronic module. When the first electrical module and the second electrical module are connected together, the connector on the right side of a first electronic module and the connector on the left side of a second electronic module are hidden from view and are connected without requiring any cables.

The method 400 can optionally perform some other tasks. For example, the method can install a fan, at 406, that spans both the first electrical module and the second electrical module. The fan pulls air through the first electronic module and the second electronic module. The routes that air travels through both modules can be custom designed so that air routed through the first electronic module is routed in a way that is best for the first module and air is routed through the second electronic module differently that the first electronic module but in a way that is best for the second module. An elongated electronic connector bridge can be placed in notches formed in the first electrical module and the second electrical module, at 408. The electronic connector bridge is elongated with first and second ends with connectors located at each end. At 410, the connector located at the first end of the electronic connector bridge is connected to a connector located in the notch of the first electronic module and the connector located at the second of the electronic connector bridge end is connected to a connector located in the notch of the second electronic module. The first electrical module and the second electrical module can be fastened together, at 412, to create an assembled electronic module that can be installed into an electronic chassis. For example, the modules can be fastened together with threaded fastening devices such as bolts or screws.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A method comprising the steps of:
    providing a first electronic module which has a front side, a back side, a right side and a first connector on the right side;
    providing a second electronic module which has a front side, a back side, a left side and a second connector on the left side;
    wherein a first finned heat exchanger is mounted on the right side of the first electronic module or the left side of the second electronic module and comprises a plurality of first cooling fins which extend rearward from the front side of the respective first or second electronic module so that the first cooling fins define therebetween a plurality of first air guide routes;
    aligning the first connector with the second connector; and
    pushing the first and second electronic modules together so that the right side of the first module is adjacent the left side of the second module, so that a plurality of first air input openings are disposed along the front side of the respective first or second electronic module at a front of the plurality of first air guide routes, so that the first connector is electrically connected to the second connector, and so that the first and second connectors are hidden from view and are connected without requiring any cables.

2. The method of claim 1 further comprising the step of installing a fan adjacent the first and second electronic modules so that the fan is configured to move air rearward through the air input openings into the first air guide routes.

3. The method of claim 1 wherein the second electronic module has a right side; and
    a second finned heat exchanger extends adjacent the right side of the second electronic module and comprises a plurality of second cooling fins which extend rearward from the front side of the second electronic module so that the second cooling fins define therebetween a plurality of second air guide routes.

4. The method of claim 3 wherein the first air guide routes are different than the second air guide routes.

5. The method of claim 3 further comprising a first pattern of the first cooling fins; and a second pattern of the second cooling fins which is different than the first pattern.

6. The method of claim 5 further comprising the step of installing a fan configured to move air across the first pattern of the first cooling fins and the second pattern of the second cooling fins.

7. The method of claim 3 further comprising the step of installing a fan configured to move air rearward through the first and second air guide routes.

8. The method of claim 1 wherein the second electronic module has a right side and a third connector on the right side of the second electronic module; further comprising the steps of:
    providing a third electronic module which has a front side, a back side, a left side and a fourth connector on the left side of the third electronic module;
    wherein a second finned heat exchanger is mounted on the right side of the second electronic module or the left side of the third electronic module and comprises a plurality of second cooling fins which extend rearward from the front side of the respective second or third electronic module so that the second cooling fins define therebetween a plurality of second air guide routes;
    aligning the third connector with the fourth connector; and
    pushing the second and third electronic modules together so that the right side of the second module is adjacent the left side of the third module, so that a plurality of second air input openings are disposed along the front side of the respective second or third electronic module at a front of the plurality of second air guide routes, so that the third connector is electrically connected to the fourth connector, and so that the third and fourth connectors are hidden from view and are connected without requiring any cables.

9. The method of claim 8 further comprising the step of installing a fan configured to move air rearward through the first air input openings into the first air guide routes and to move air rearward through the second air input openings into the second air guide routes.

10. The method of claim 9 wherein the first air guide routes are different than the second air guide routes.

11. The method of claim 8 further comprising a first pattern of the first cooling fins; and a second pattern of the second cooling fins which is different than the first pattern.

12. The method of claim 8 wherein the third electronic module has a right side; and
a third finned heat exchanger extends adjacent the right side of the third electronic module and comprises a plurality of third cooling fins which extend rearward from the front side of the third electronic module so that the third cooling fins define therebetween a plurality of third air guide routes.

13. The method of claim 12 further comprising:
a first pattern of the first cooling fins;
a second pattern of the second cooling fins which is different than the first pattern; and
a third pattern of the third cooling fins which is different than the first and second patterns.

14. The method of claim 13 further comprising the step of installing a fan configured to move air across the first pattern of the first cooling fins, the second pattern of the second cooling fins and the third pattern of the third cooling fins.

15. The method of claim 8 wherein the first electronic module has a fifth connector;
the third electronic module has a sixth connector; and
further comprising the steps of:
providing an electronic connector bridge comprising a body, a seventh connector, an eighth connector, and internal wiring which is housed in the body and connects the seventh and eighth connectors;
attaching the electronic connector bridge to one or more of the first, second and third electronic modules so that the seventh connector is electrically connected to the fifth connector and the eighth connector is electrically connected to the sixth connector to electrically connect the first electronic module to the third electronic module through the connector bridge, and so that the electronic connector bridge does not electrically connect to the second electronic module.

16. The method of claim 15 wherein the step of attaching comprises placing the electronic connector bridge in first, second and third notches which are respectively formed in the first, second and third electronic modules.

17. The method of claim 1 wherein the first finned heat exchanger is mounted on the right side of the first electronic module so that the first cooling fins extend rearward from the front side of the first electronic module;
a second finned heat exchanger is mounted on the left side of the second electronic module and comprises a plurality of second cooling fins which extend rearward from the front side of the second electronic module so that the second cooling fins define therebetween a plurality of second air guide routes; and
the step of pushing comprises moving the first cooling fins to a position adjacent the second cooling fins.

18. The method of claim 1 further comprising the step of fastening the first electrical module and the second electrical module together to create an assembled electronic module.

19. The method of claim 18 wherein the step of fastening comprises fastening the first electrical module and the second electrical module together with threaded fastening devices.

20. The method of claim 18 further comprising the step of installing the assembled electronic module into an electronic chassis.

* * * * *